United States Patent
Choe et al.

(10) Patent No.: US 10,067,214 B2
(45) Date of Patent: Sep. 4, 2018

(54) FUSION PHANTOM FOR TESTING PERFORMANCE OF MAGNETIC RESONANCE IMAGING AND MAGNETIC RESONANCE SPECTROSCOPY

(71) Applicant: THE CATHOLIC UNIVERSITY OF KOREA INDUSTRY-ACADEMIC COOPERATION FOUNDATION, Seoul (KR)

(72) Inventors: Bo Young Choe, Seoul (KR); Kyu-Ho Song, Gyeonggi-do (KR); Sang-Young Kim, Seoul (KR); Do-Wan Lee, Seoul (KR)

(73) Assignee: The Catholic University of Korea Industry-Academic Cooperation Foundation, Seoul (KR)

( * ) Notice: Subject to any disclaimer, the term of this patent is extended or adjusted under 35 U.S.C. 154(b) by 834 days.

(21) Appl. No.: 14/629,612

(22) Filed: Feb. 24, 2015

(65) Prior Publication Data

US 2015/0241542 A1 Aug. 27, 2015

(30) Foreign Application Priority Data

Feb. 24, 2014 (KR) ........................ 10-2014-0021138

(51) Int. Cl.
*G01R 33/58* (2006.01)

(52) U.S. Cl.
CPC .................................. *G01R 33/58* (2013.01)

(58) Field of Classification Search
CPC ...................................................... G01R 33/58
See application file for complete search history.

(56) References Cited

U.S. PATENT DOCUMENTS

| 4,581,583 A * | 4/1986 | Van Vliet | G01R 33/28 324/321 |
| 5,146,166 A * | 9/1992 | Bartuska | G01R 33/307 324/321 |
| 5,534,780 A * | 7/1996 | Lilly | G01R 33/307 324/321 |
| 5,952,831 A * | 9/1999 | Yamakoshi | G01R 33/307 324/316 |
| 7,728,593 B2 * | 6/2010 | Norell | G01R 33/30 324/318 |
| 7,764,064 B2 * | 7/2010 | Reiss | G01R 33/30 324/307 |

(Continued)

*Primary Examiner* — Dixomara Vargas
(74) *Attorney, Agent, or Firm* — Eric W. Cernyar; James W. Huffman (57) ABSTRACT

A new imaging phantom called a "fusion phantom" enhances the efficiency of performance testing and quality control. The phantom relocates the test elements of a standard MRI phantom, and provides a configuration of inner containers that enables simultaneous performance testing on magnetic resonance imaging and magnetic resonance spectroscopy within a predetermined error range.

The fusion phantom is useful for multi-purpose performance testing of magnetic resonance imaging equipment, including correlation analysis, performance testing, system management and the like in the diagnosis field. The fusion phantom enhances efficiency of time and reliability in testing performance of the magnetic resonance imaging equipment, adjusts incorrect position accuracy and improves quality of images.

10 Claims, 8 Drawing Sheets

(56) References Cited

U.S. PATENT DOCUMENTS

| | | | |
|---|---|---|---|
| 8,054,080 B2* | 11/2011 | Norell | G01R 33/30 |
| | | | 324/318 |
| 9,603,546 B2* | 3/2017 | Horkay | A61B 5/055 |
| 2016/0282439 A1* | 9/2016 | Choe | G01R 33/58 |
| 2017/0336490 A1* | 11/2017 | Suh | G01R 33/58 |

* cited by examiner

FUSION PHANTOM FOR TESTING PERFORMANCE OF MAGNETIC RESONANCE IMAGING AND MAGNETIC RESONANCE SPECTROSCOPY

BACKGROUND OF THE INVENTION

Field of the Invention

The present invention relates to performance testing of magnetic resonance imaging and magnetic resonance spectroscopy, and more specifically, to an imaging phantom.

Background of the Related Art

The ACR-MRI phantom (American college of radiology-magnetic resonance imaging phantom) conducts a performance test on magnetic resonance imaging based on an existing phantom protocol in order for image interpretation and accurate analysis of medical equipment. When the performance goes out of an allowable error range of a human MRI system, this phantom presents the parts expected to have a problem and accesses and solves the problem. The phantom confirms whether the human MRI system normally operates in relation to hardware. If an error going beyond the allowable error range occurs, the phantom accesses the problem to inspect related elements and solve the problem through daily quality control.

Magnetic resonance spectroscopy is a method of performing chemical investigation and quantization that provides information on metabolites of a body based on anatomical and histological images. Magnetic resonance spectroscopy is used to identify changes in a cell for early diagnosis based on analysis of spectra, to test the effects of treatments in treating a disease as a method of distinguishing difference of concentration in various metabolites of a human body, and to perform quantized chemical analysis of cerebral metabolites by using a technique of position accuracy based on a change of metabolite at a position where a disease occurs.

In conducting the magnetic resonance spectroscopy and the magnetic resonance imaging, there is a need to perform a prior performance test on the human MRL. A magnetic resonance spectroscopy imaging phantom has been developed based on a patent document (Korean Patent Registration No. 10-0961892) of a prior technical document. However, there is a small deficiency from the aspect of efficiency of time, which is important in the diagnosis field.

SUMMARY OF THE INVENTION

The present invention provides what k referred to herein as a "fusion phantom" for testing performance of magnetic resonance imaging and magnetic resonance spectroscopy. The fusion phantom is capable of simultaneously conducting performance tests on the magnetic resonance imaging and the magnetic resonance spectroscopy within a predetermined error range. The fusion phantom grasps a degree of performance capability of a human MRI system from a comprehensive result of image conditions and image parameters in order to enhance efficiency of performance test and quality control of the human MRI system.

One embodiment of the fusion phantom comprises inner containers, a geometric accuracy test device, a spatial resolution test device, and a contrast resolution test device. The inner containers perform a quantitative test and analysis by changing a type and concentration of an internal metabolite. The geometric accuracy test device, configured in one implementation as a lattice frame, measures a distance. The spatial resolution test device is configured of holes of different diameters to perform an analysis on a hole image. The contrast resolution test device performs a test on thickness and contrast by arranging disk layers of different thicknesses, each layered disk having a plurality of holes formed at different positions. By grasping the number of distinguishable hole images that are installed inside one outer container, the fusion phantom simultaneously acquires performance test and quality control for the magnetic resonance imaging and the magnetic resonance spectroscopy of a magnetic resonance imaging system using one phantom.

Accordingly, if a test performed by the fusion phantom of the present invention is compared with a quality control test of a human MRI system according to a conventional phantom, performance test and quality control of the phantom for magnetic resonance imaging and magnetic resonance spectroscopy can be acquired within a very short time, and the performance test and quality control can be accurately acquired by adjusting incorrect position accuracy and improving quality of images. In addition, since the fusion phantom can perform a quantitative test and a quantized chemical analysis on each metabolite, efficiency of time and reliability in the diagnosis field can be enhanced.

To accomplish the above objects, according to one aspect of the present invention, there is provided a fusion phantom for testing performance of magnetic resonance imaging and magnetic resonance spectroscopy, in which constitutional elements for testing performance of American college of radiology-magnetic resonance imaging (ACR-MRI) are arranged, and the phantom comprises: an outer container having an injection hole formed at a center portion of a top surface to be opened and closed using a stopper, and a plurality of insertion holes formed around the injection hole and along a circular arc of an outer circumference to be opened and closed using a stopper; inner containers respectively inserted into the insertion holes of the outer container, for quantitatively testing cerebral metabolites using solutions contained therein; a geometric accuracy test device installed in the middle of the outer container in a shape of a lattice type frame; a spatial resolution test device arranging a plurality of hole groups configured of spatial test holes formed at the same diameter in a test frame in parallel at regular intervals, which is installed at one side of the bottom inside the outer container to have a different hole diameter for each hole group; and a contrast resolution test device arranging a plurality of disk layers of different thicknesses in vertical direction at regular intervals, which is installed at the other side of the bottom inside the outer container to have a plurality of contrast test holes of different thicknesses formed on each of the disks.

In addition, it is preferable that each of the inner containers is configured in layers to form steps having a diameter gradually decreasing from the top to the bottom, and a solution mimicking a cerebral metabolite is injected into each step of the layers from the bottom layer inside each inner container.

In addition, it is preferable that the hole groups of the spatial resolution test device are configured of a plurality of spatial test holes of the same diameter in a matrix form, and the hole groups of the matrix form are arranged in pairs to be diagonally opposed.

In addition, it is preferable that the plurality of contrast test holes formed on each disk of the contrast resolution test device is configured in a shape of a plurality of holes having diameters gradually decreasing clockwise along circular arcs of a center portion, a middle portion and an outer circumference on the disk of each layer.

In addition, it is preferable that a copper sulfate solution and a sodium chloride aqueous solution are injected into the outer container through the injection hole.

In addition, it is preferable that seven insertion holes for inserting the inner containers are formed at regular intervals along a circular arc apart from the center point of the injection hole by a predetermined distance on the top surface of the outer container, and nine insertion holes are formed at regular intervals along a circular arc on a circumference of the top surface further apart from the center point of the injection hole by a predetermined distance on the top surface of the outer container.

In addition, it is preferable that the phantom preferably further includes a rubber ring installed around a lower end portion of each stopper to tightly seal the injection hole or each of the insertion holes.

In addition, since the spatial resolution test device and the contrast resolution test device are arranged in a line, it is preferable that a test on high-contrast spatial resolution and low-contrast object detectability are simultaneously performed using one slice.

In addition, it is preferable that the outer container, the inner containers, the lattice frame of the geometric accuracy test device, the test frame of the spatial resolution test device and the disks of the contrast resolution test device are configured of an acrylic material.

DESCRIPTION OF SYMBOLS

1: Outer container
2a, 2b: Inner container
3: Geometric accuracy test device
4: Spatial resolution test device
5: Contrast resolution test device
6: Injection hole
7a, 7b: Insertion hole
8: Stopper
8a: Rubber ring
9: Hole group
9a: Spatial test hole
10a, 10b, 10c: Disk
11: Supporting member
12a, 12b, 12c: Contrast test hole
13: Test frame
14: Lattice

DETAILED DESCRIPTION OF THE PREFERRED EMBODIMENT

Hereafter, the preferred embodiment of a fusion phantom for testing performance of magnetic resonance imaging and magnetic resonance spectroscopy according to the invention will be described in detail with reference to the accompanying drawings. The present invention is not limited to the following embodiments but may be implemented in various different forms. The embodiments are provided merely to complete disclosure of the present invention and to fully provide a person having ordinary skill in the art to which the present invention pertains with the category of the invention.

A fusion phantom for testing performance of magnetic resonance imaging and magnetic resonance spectroscopy of the present invention is designed and manufactured to simultaneously acquire performance tests on the magnetic resonance imaging and the magnetic resonance spectroscopy through one phantom using magnetic resonance imaging equipment and uses the test elements of an ACR-MRI phantom used as a standard phantom for testing magnetic resonance imaging and inner containers (layered shape vials) formed in stepped layers to conduct a performance test on the magnetic resonance spectroscopy.

The fusion phantom for testing performance of magnetic resonance imaging and magnetic resonance spectroscopy of the present invention is a phantom capable of quantitatively testing performance of a magnetic resonance imaging system and can be used as a fused phantom for conducting performance test and quality control by using an optimized analysis method which can simultaneously test high-contrast spatial resolution and low-contrast object detectability of a magnetic resolution image using an existing ACR-MRI phantom and a magnetic resonance spectroscopy (MRS) phantom. Since performance test elements and quality control elements of the magnetic resonance imaging and the magnetic resonance spectroscopy are allowed by inventing a phantom capable of acquiring the performance test and the quality control simultaneously, it is expected to be helpful in the clinical diagnosis field when magnetic resonance imaging equipment is used.

Figure 1:
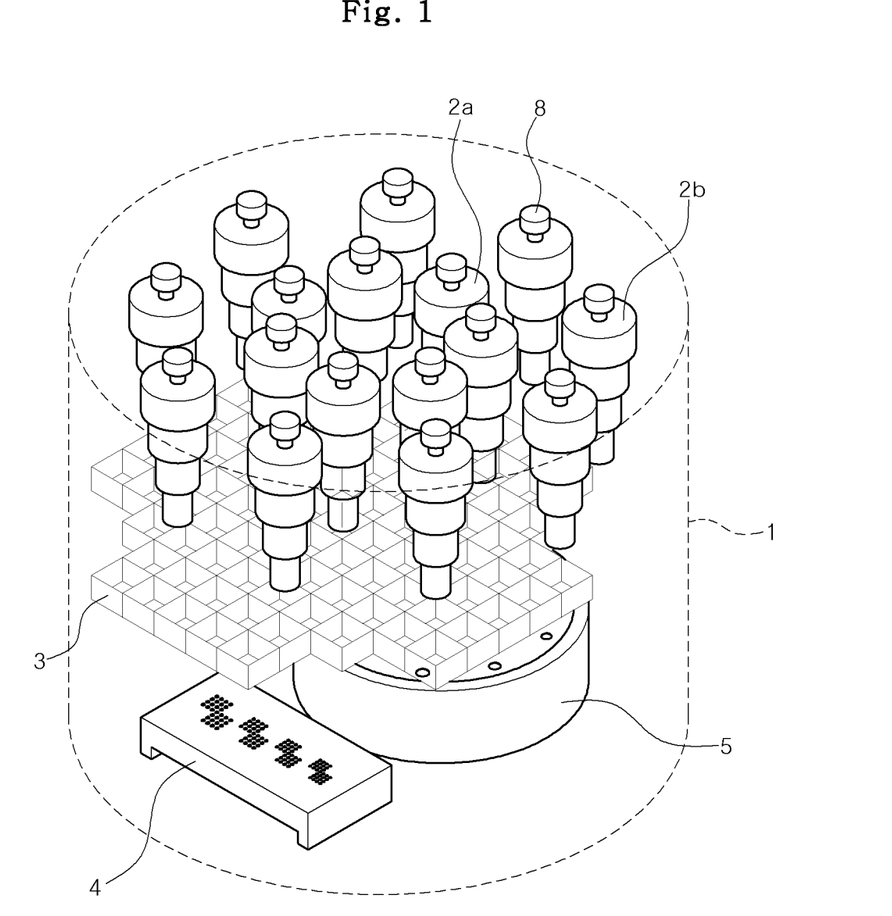
FIG. 1 is a perspective view showing an internal image of a fusion phantom according to the present invention.
Figure 2:
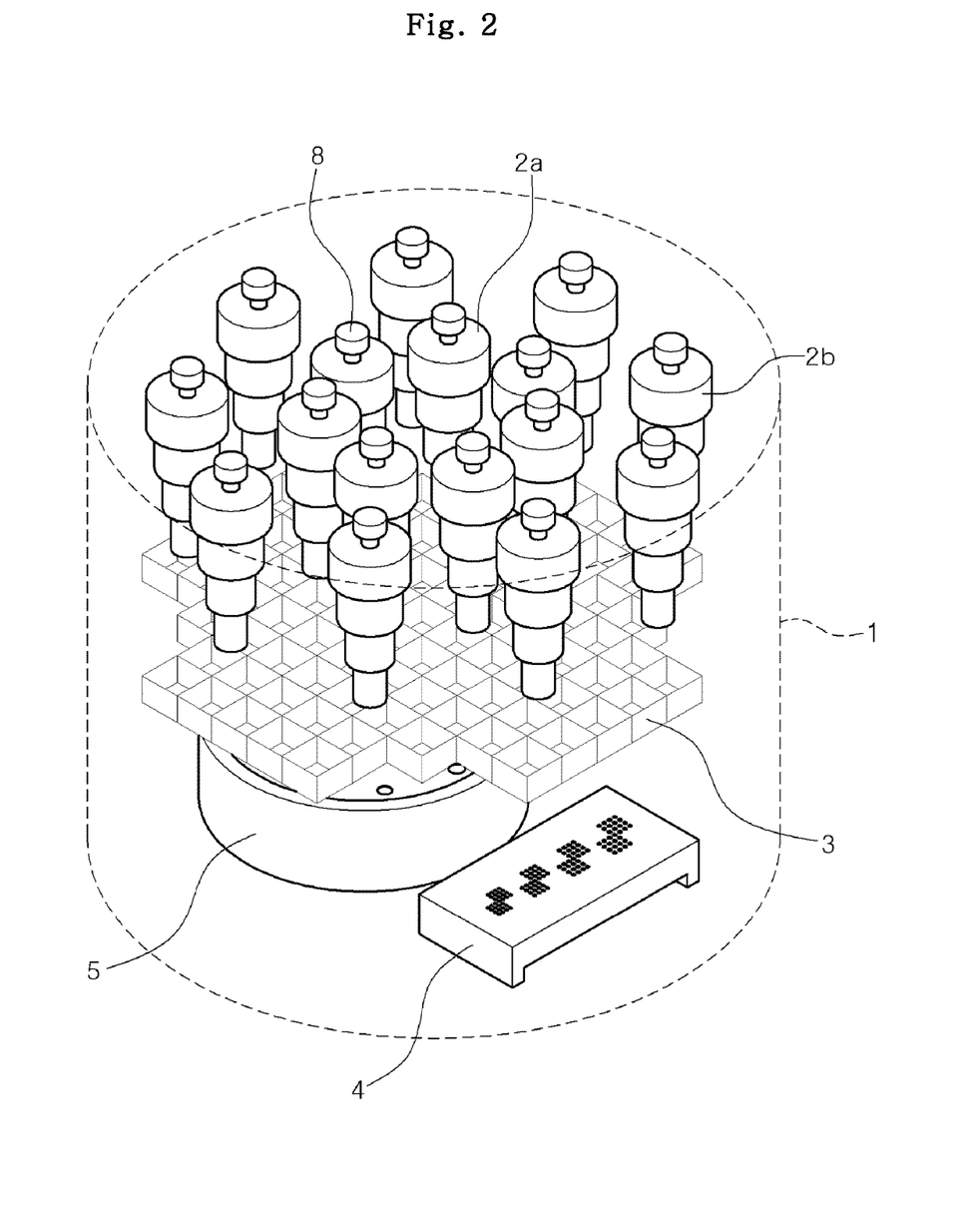
FIG. 2 is a perspective view showing an internal image of a fusion phantom according to the present invention, from another angle.
Figure 3:
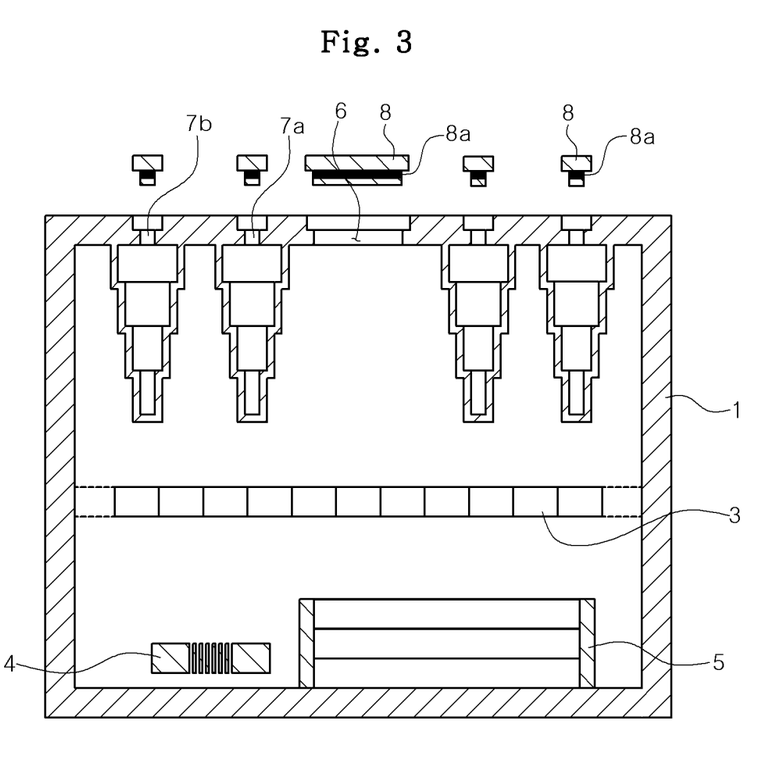
FIG. 3 is a longitudinal sectional view showing a fusion phantom according to the present invention.

FIG. 1 is a perspective view showing an internal image of a fusion phantom according to the present invention, FIG. 2 is a perspective view showing an internal image of a fusion phantom according to the present invention, from another angle, and FIG. 3 is a longitudinal sectional view showing a fusion phantom according to the present invention.

As shown in FIGS. 1 to 3, a fusion phantom for testing performance of magnetic resonance imaging and magnetic resonance spectroscopy according to the present invention includes an outer container 1, a plurality of inner containers 2a and 2b installed inside the outer container, a geometric accuracy test device 3, a spatial resolution test device 4, and a contrast resolution test device 5 as a basic configuration.

Figure 4:
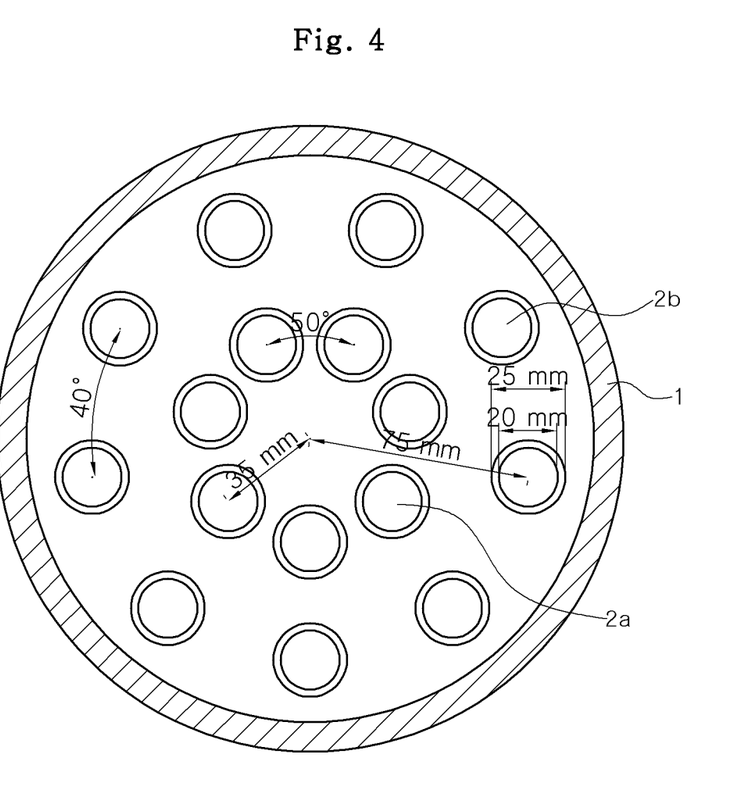
FIG. 4 is a planar sectional view showing a cylindrical outer container of a fusion phantom according to the present invention.

The outer container 1 is formed of a cylindrical acrylic material having a thickness of 10 mm, a diameter of 212 mm and a height of 170 mm, and as the outer container is formed of an acrylic material, a magnetic field is not generated even in a strong magnetic field. An injection hole 6 having an outer diameter of 35 mm and an inner diameter of 30 mm is formed at the center portion of the outer container 1 to inject a material, and a plurality of insertion holes 7a and 7b for inserting the inner containers 2 formed in four layers (layered shape vials) for injecting various metabolites are formed around the injection hole in a circular shape. That is, as shown in FIG. 4, seven insertion holes 7a respectively having an outer diameter of 10 mm and an inner diameter of 5 mm are formed around the injection hole 6 at regular intervals along a circular arc, starting from a point 35 mm apart from the center point of the injection hole 6 formed on the top surface of the outer container 1, and the insertion holes 7a are arranged at the intervals of 50 and 52.5 degrees, and nine insertion holes 7b respectively having an outer diameter of 10 mm and an inner diameter of 5 mm are formed at regular intervals along a circular arc, starting from a point 75 mm apart from the center point of the injection hole 6, and the insertion holes 7b are arranged at the intervals of 40 degrees. The insertion holes 7a and 7b are arranged to quantitatively analyze the metabolites by inserting the inner containers 2 as many as possible, and the insertion holes are arranged keeping a distance to each other in order to reduce the artifact to the air of other inner containers 2 with respect to each of the inner containers 2a and 2b.

All the holes including the injection hole 7 and the insertion holes 7a and 7b are respectively sealed with a stopper 8 made of a polyethylene bolt to prevent leakage of water, and a rubber ring 8a is inserted around the lower end portion of the stopper 8 to remove a cause of the artifact generated by the air and to prevent inflow of the air.

Copper sulfate ($CuSO_4$; 0.7 g/L) is injected into the outer container 1 through the injection hole 6 to fill inside thereof, except the inner containers 2a and 2b formed in a layered shape, in order to reduce T1 relaxation time, and the copper sulfate diluted with water reduces the T1 relaxation time of the water and helps strengthening a signal when a magnetic resonance image and a magnetic resonance spectrum are acquired.

Figure 5:
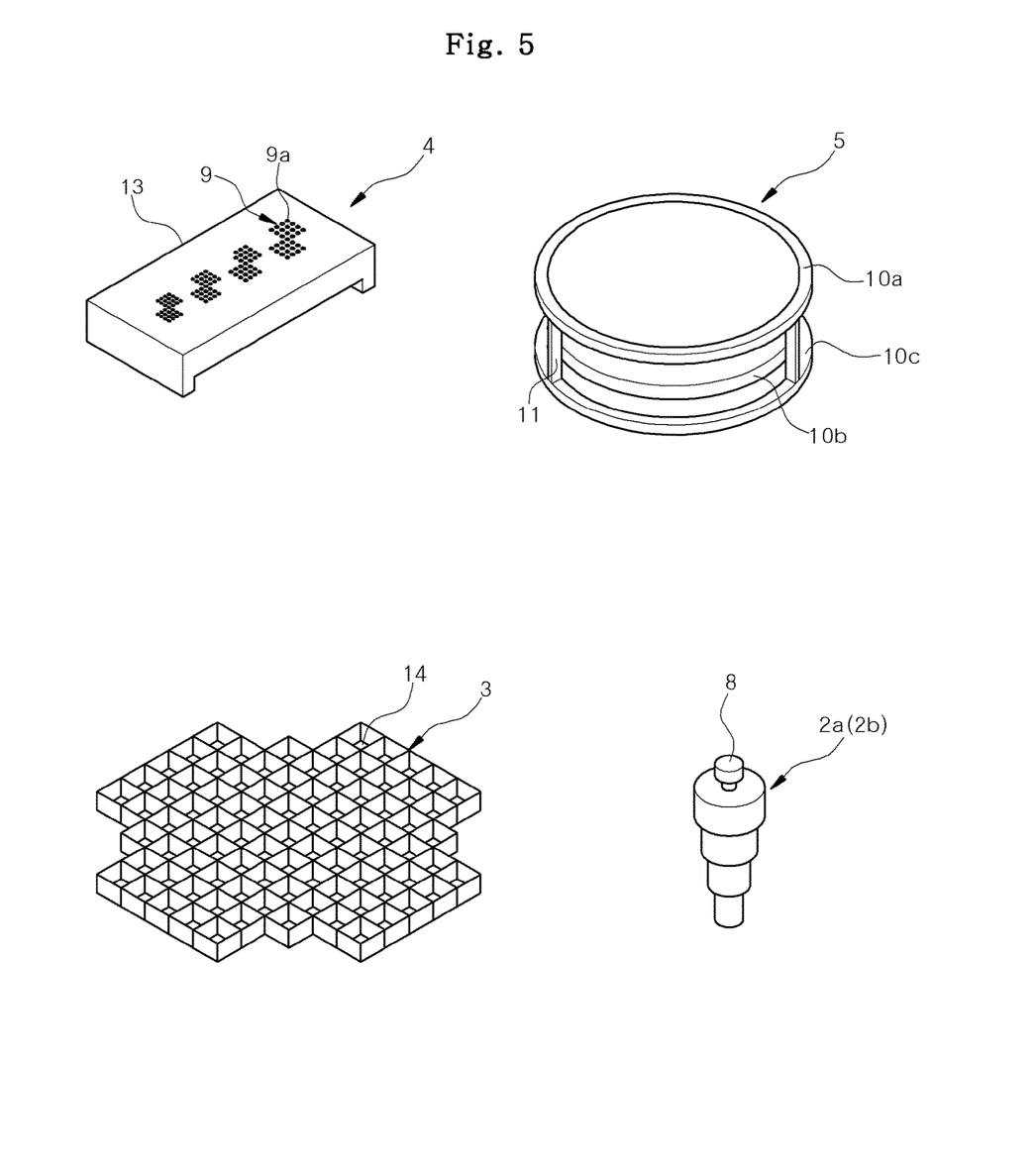
FIG. 5 shows perspective views of an inner container, a geometric accuracy test device, a spatial resolution test device and a contrast resolution test device installed inside an outer container of a fusion phantom according to the present invention.
Figure 6:
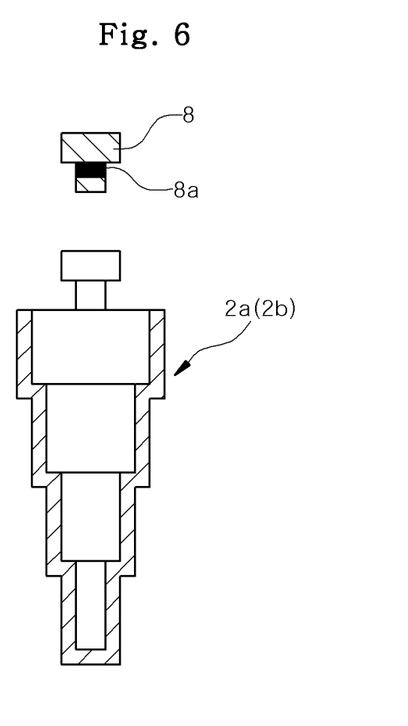
FIG. 6 is a longitudinal sectional view showing an inner container installed inside a cylindrical outer container of a fusion phantom according to the present invention.

The inner containers 2a and 2b are inserted into the insertion holes 7a and 7b formed on the top surface of the outer container 1 and sealed with stoppers 8, and thus sixteen inner containers 2 are installed on the top surface of the outer container 1. As shown in FIGS. 5 and 6, the inner containers 2a and 2b are containers formed in stepped layers by decreasing the inner diameter in order of 20 mm, 15 mm, 10 mm and 5 mm from the top to the bottom, and its height is 60 mm. Quantitative accuracy and positional accuracy of a volume of interest can be measured by adjusting the amount of a material, i.e., metabolite, contained in the voxel of each layer stepped by the shape of the inner containers 2a and 2b. By the shape of the inner containers 2a and 2b like this, an effect of partial volume can be prevented by selecting an accurate volume of interest. Since the inner containers 2a and 2b are also formed of an acrylic material, a magnetic field is not generated even in a strong magnetic field.

Each step of the layers is created as a vacuum state and filled with a metabolite solution similar to a cerebra; material to express the cerebral material inside the inner containers 2a and 2b, and pH 7 is rendered as a pH of the solution having an ingredient similar to a human body by mixing Monopotassium phosphate ($KH_2PO_4$; 32 mM) and Tripotassium phosphate ($K_3PO_4$; 18 mM). The inner containers 2 (layered shape vials) formed in layers are filled with a solution mimicking a cerebral metabolite as shown in Table 1.

TABLE 1

| Chemical Name | Abbreviation | CAS No. | Concentration (mM) | g/L | Molar mass (g/mol) |
| --- | --- | --- | --- | --- | --- |
| N-acetyl-L-aspartic acid | NAA | 997-55-7 | 12.5 | 2.1893 | 175.14 |
| Creatine hydrate | Cr | 57-00-1 | 10.0 | 1.1311 | 131.13 |
| Choline chloride | Cho | 67-48-1 | 3.0 | 0.4189 | 139.62 |
| Myo-inositol | mI | 87-89-8 | 7.5 | 1.3512 | 180.16 |
| L-Glutamic acid | Glu | 6106-06-03 | 12.5 | 1.8391 | 147.13 |
| DL-lactic acid | Lac | 16891-53-5 | 5.0 | 0.4504 | 90.08 |
| 4-Aminobutyric acid | GABA | 1956-12-02 | 10.0 | 1.0312 | 103.12 |
| L-Alanine | Al | 56-41-7 | 10.0 | 0.8909 | 89.09 |
| L-Glutamine | Gln | 6106-04-03 | 12.5 | 1.8268 | 146.14 |
| Taurine | Tau | 107-35-7 | 6.0 | 0.7509 | 125.15 |

The internal constitutional elements of an existing ACR-MRI phantom are rearranged and inserted at predetermined positions under the inner containers 2 installed on the top of the external container 1.

That is, the geometric accuracy test device 3 for testing geometric accuracy is installed in the middle of the outer container 1, and the spatial resolution test device 4 and the contrast resolution test device 5 for simultaneously acquiring High-contrast spatial resolution and Low-contrast object detectability are installed in the lower end portion under the geometric accuracy test device to have the same height and position.

Figure 7:
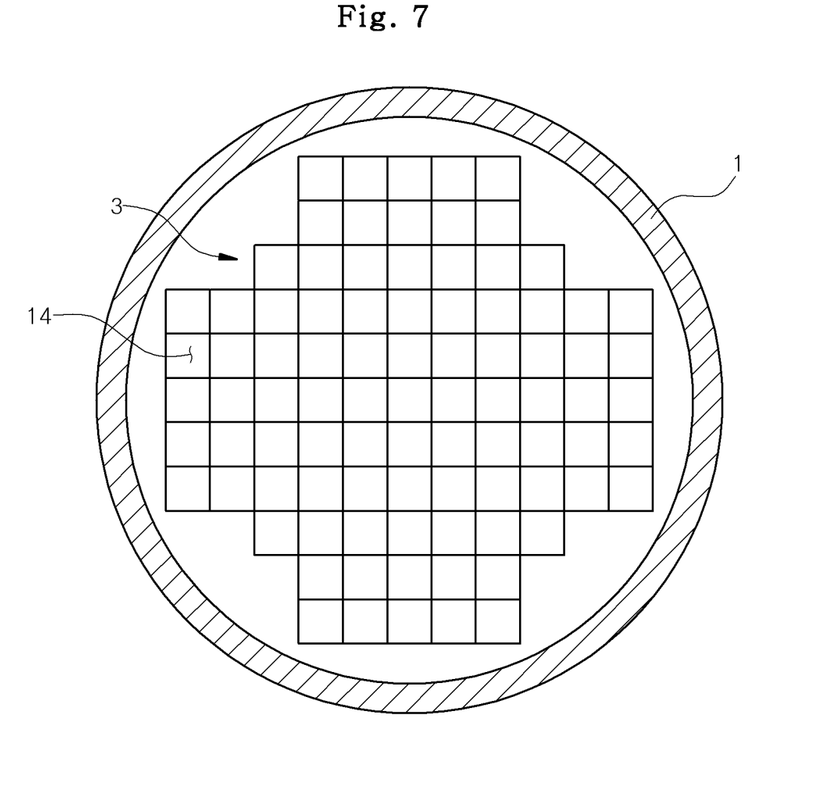
FIG. 7 is a planar sectional view showing a lower end portion inside a cylindrical outer container of a fusion phantom according to the present invention.

As shown in FIGS. 5 and 7, the geometric accuracy test device 3 is a lattice type frame arranged to come down to the middle, which is approximately 82 mm apart from the top of the outer container 1. The lattice type frame used for testing geometric accuracy is configured as a rectangular frame having a width of 15 mm, a length of 15 mm and a height of 10 mm to form a honeycomb shape having a plurality of 15×15 mm lattices 14, and a protruded outer portion has a length of 75 mm in the width direction and is 13.5 mm apart from the inner diameter surface of the outer container 1. When a magnetic resonance image is acquired, the geometric accuracy test device 3 may determine an accurate geometric length of the magnetic resonance image and test accuracy of position within an allowable error range by calculating a distance between intersections of lattices as a distance of a measurement target in the image.

Figure 8:
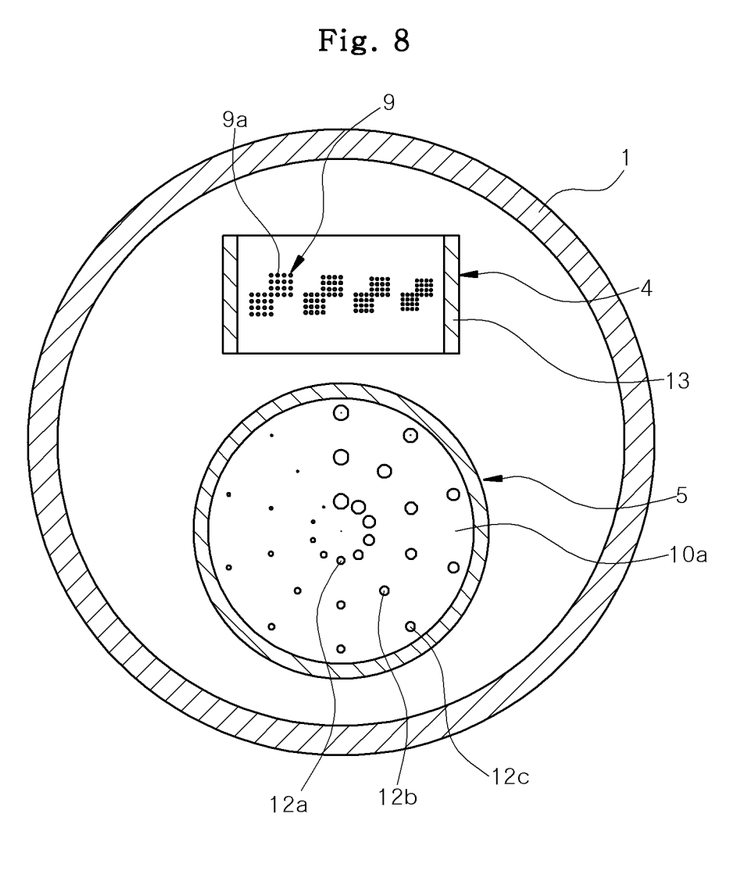
FIG. 8 is a planar sectional view showing a middle portion inside a cylindrical outer container of a fusion phantom according to the present invention.

As shown in FIGS. 5 and 8, the spatial resolution test device 4 for testing a high-contrast spatial resolution is installed at one side of the bottom inside the outer container 1 in the form of a test frame 13, and a plurality of hole groups 9 respectively configured of spatial test holes 9a formed at the same diameter are arranged in the test frame 13 in pairs of diagonally opposing matrixes, and a plurality of the pair of hole groups 9 of a matrix form is arranged in parallel at regular intervals, in which the size of a spatial test hole 9a in each hole group 9 is different from those of the other groups. That is, the spatial test holes 9a are formed to have a diameter of 1.1 mm, 1.0 mm, 0.9 mm and 0.8 mm in order from one side to have the same depth of 10 mm and configured in the form of a 4×4 hole group 9. The spatial resolution test device 4 is used to analyze whether or not the spatial test holes 9a can be clearly distinguished from each other through a magnetic resonance image when the image is acquired by the spatial test holes 9a of each hole group 9 formed at a different diameter. Accordingly, a test for verifying a magnetic resonance image can be further accurately and easily accomplished, compared with the limited test area of an existing phantom, by the test frame of the spatial resolution test device 4 in which spatial test holes 9a of different diameters are arranged.

As shown in FIGS. 5 and 8, the contrast resolution test device 5 for testing low-contrast object detectability is installed at the other side of the bottom inside the outer container 1 in the form of three disks 10a, 10b and 10c arranged in each layer to be supported by supporting members. Contrast test holes 12a, 12b and 12c having diameters gradually decreasing in order of 5.0 mm, 4.5 mm, 4.0 mm, 3.5 mm, 3.0 mm, 2.5 mm, 2.0 mm, 1.5 mm, 1.0 mm and 0.5 mm are formed in the center portion, the middle portion and the circumferential portion at regular intervals rotating clockwise along a circular arc by thirty-six degrees, and three contrast test holes 12a, 12b and 12c, starting first in the direction toward the end of the arc of each of the disks 10a, 10b and 10c, are formed in one line at the same diameter (5 mm).

In addition, the disks 10a, 10b and 10c formed in three layers to test low-contrast object detectability are respectively rotate clockwise by fifteen degrees from the top layer to the bottom layer to distinguish each layer when an image of each slice of a measurement target is acquired. Accordingly, the contrast test holes 12a, 12b and 12c on each of the disks 10a, 10b and 10c are placed not at the same position, but at positions offset from each other. An uppermost first layer of the disks 10a, 10b and 10c has a thickness of 0.15 mm, a second layer under the first layer has a thickness of 0.1 mm, and a third layer under the second layer has a thickness of 0.05 mm. How many of the contrast test holes 12a, 12b and 12c formed on the disks 10a, 10b and 10c are needed to grasp each slice of a measurement target contained in an image on the magnetic resonance is determined by the three layer disks 10a, 10b and 10c of different thicknesses for testing low-contrast object detectability, and it is used to test the thickness and contrast of the measurement target.

Since the lattice frame of the geometric accuracy test device 3, the test frame of the spatial resolution test device 4 and the disks of the contrast resolution test device 5 are formed of an acrylic material like the outer container 1 and the inner containers 2, a magnetic field is not generated even in a strong magnetic field.

According to the fusion phantom for testing performance of magnetic resonance imaging and magnetic resonance spectroscopy of the present invention, it has an effect of enhancing efficiency of time since the high-contrast spatial resolution and the low-contrast object detectability are simultaneously acquired when performance of magnetic resonance imaging is tested by arranging devices for testing a position of a slice, the high-contrast spatial resolution and the low-contrast object detectability in an end portion below a device for testing geometric accuracy formed in the middle of the cylindrical outer container. In addition, it has an effect of further precisely and accurately testing the low-contrast object detectability by separating the acrylic disks for testing the low-contrast object detectability into three layers of 0.05 mm, 0.10 mm and 0.15 mm.

In addition, since the phantom is formed in a structure using sixteen inner containers arranged on the top of the outer container and arranging each of the inner containers in a shape of stepped layers while putting emphasis on a single volume spectroscopy technique, the amount of metabolites in each inner container can be adjusted, and thus it has an effect of showing a desired signal when a spectrum is acquired by using magnetic resonance spectroscopy and measuring quantitative accuracy of the amount of metabolite of a volume of interest. In addition, it also has an effect of accurately measuring accuracy of position of the volume of interest when performance of magnetic resonance imaging is tested.

Accordingly, in testing performance of a magnetic resonance imaging (Human MRI) system, the phantom for testing performance of magnetic resonance imaging and magnetic resonance spectroscopy according to the present invention may measure geometric accuracy, high-contrast spatial resolution, accuracy of slice position, uniformity of image intensity, low-contrast object detectability, signal percentage and the like of a magnetic resonance image. In addition, when a spectrum is acquired by using the magnetic resonance spectroscopy, a signal-to-noise ratio, accuracy of a volume position, accuracy of a volume quantity, symmetry of a moisture signal, a degree of moisture suppression, chemical shift, a line width and the like more are more accurate than those of a conventional phantom, and a quantitative test and analysis can be conducted on a variety of metabolites, and since the test and analysis functions can be simultaneously acquired while maintaining performance of equipment when the magnetic resonance imaging and the magnetic resonance spectroscopy of the human MRI system are tested, it has an effect of acquiring the functions in a short time, and it is expected to improve reliability of performance of the equipment.

While the fusion phantom for testing performance of magnetic resonance imaging and magnetic resonance spectroscopy according to the present invention has been described with reference to the particular illustrative embodiments, it is not to be restricted by the embodiments but only by the appended claims. It is to be appreciated that those skilled in the art can change or modify the embodiments without departing from the scope and spirit of the present invention.

What is claimed is:

1. An imaging phantom for testing performance of magnetic resonance imaging and magnetic resonance spectroscopy, the phantom comprising:
    an outer container having an injection hole formed at a center portion of a top surface and configured for opening and closing with a stopper, and a plurality of insertion holes formed around the injection hole and along a circular arc of an outer circumference configured for opening and closing with stopper;
    inner containers respectively inserted into the insertion holes of the outer container;
    a geometric accuracy test device configured to assess a length of a magnetic resonance image and assess, or aid in the assessment, of whether the length falls within an acceptable error range, wherein the geometric accuracy test device is installed in a middle of the outer container in a shape of a lattice type frame;
    a spatial resolution test device comprising a frame in which a plurality of hole groups are arranged, wherein:

each hole group comprises spatial test holes formed of a common diameter in the frame;

the common diameter of the spatial test holes of each hole group's is different from the common diameter of the spatial test holes of each other hole group in the device;

the hole groups are arranged in the test device at regular intervals; and the spatial resolution test device is installed at one side of a bottom inside the outer container; and a contrast resolution test device comprising an arrangement a plurality of disks arranged in layers of different thicknesses at regular intervals along a vertical direction and an arrangement of a plurality of contrast test holes on each disk, wherein the contrast resolution test device is installed at the other side of the bottom inside the outer container.

2. The imaging phantom according to claim 1, wherein each of the inner containers is configured in stepped layers whose diameters gradually decrease from a top to a bottom.

3. The imaging phantom according to claim 2, further comprising a solution mimicking a cerebral metabolite in each stepped layer of each inner container.

4. The imaging phantom according to claim 1, wherein the hole groups of the spatial resolution test device are configured of a plurality of spatial test holes of a same diameter in a matrix form, and the hole groups of the matrix form are arranged in pairs to be diagonally opposed.

5. The imaging phantom according to claim 1, wherein the plurality of contrast test holes formed on each disk of the contrast resolution test device is configured in a shape of a plurality of holes having diameters gradually decreasing clockwise along three concentric circular arcs of the disk.

6. The imaging phantom according to claim 1, further comprising a copper sulfate solution and a sodium chloride aqueous solution in the outer container.

7. The imaging phantom according to claim 1, the outer container further comprising:

a first group of seven insertion holes configured to receive the inner containers, wherein the seven insertion holes are formed along and equally spaced about an inner circular arc around a center point of the injection hole on the top surface of the outer container; and a second group of nine insertion holes configured to receive the inner containers, wherein the nine insertion holes are formed along and equally spaced about an outer circular arc around the center point of the injection hole.

8. The imaging phantom according to claim 1, further comprising one or more rubber rings installed around a lower end portion of each stopper to seal the injection hole and/or each of the insertion holes.

9. The imaging phantom according to claim 1, wherein the spatial resolution test device and the contrast resolution test device are linearly arranged, enabling a test on high-contrast spatial resolution and low-contrast object detectability to be simultaneously performed using one slice.

10. The imaging phantom according to claim 1, wherein the outer container, the inner containers, the lattice frame of the geometric accuracy test device, the test frame of the spatial resolution test device and the disks of the contrast resolution test device are configured of an acrylic material.

* * * * *